United States Patent [19]
Kaufman

[11] 4,266,140
[45] May 5, 1981

[54] POSITIONING MEANS FOR OPTICALLY COUPLABLE CIRCUIT ELEMENTS

[76] Inventor: Lance R. Kaufman, 131 White Oak Way, Mequon, Wis. 53092

[21] Appl. No.: 962,750

[22] Filed: Nov. 21, 1978

[51] Int. Cl.³ .............................................. G02B 27/00
[52] U.S. Cl. ...................................... 250/551; 357/19
[58] Field of Search ................ 250/551, 211 R, 211 J; 357/19

[56] References Cited

U.S. PATENT DOCUMENTS

| | | |
|---|---|---|
| 3,845,318 | 10/1974 | Thillays ................................ 250/551 |
| 4,058,821 | 11/1977 | Miyoshi et al. ......................... 357/19 |
| 4,125,777 | 11/1978 | O'Brien et al. ....................... 250/551 |
| 4,156,148 | 5/1979 | Kaufman .............................. 250/551 |

*Primary Examiner*—David C. Nelms
*Attorney, Agent, or Firm*—Andrus, Sceales, Starke & Sawall

[57] ABSTRACT

Electrical circuitry includes at least a pair of thick-film conductor circuits on a substrate. A light responsive device, such as a light actuated controlled rectifier, is connected in one circuit and a light emitting element, such as a light emitting diode, is connected in the second circuit. The diode is positioned to optically couple the photo-sensitive area of a silicon controlled rectifier by a pair of arms cantilevered from spacers connected to the thick film conductors of the second circuit.

7 Claims, 4 Drawing Figures

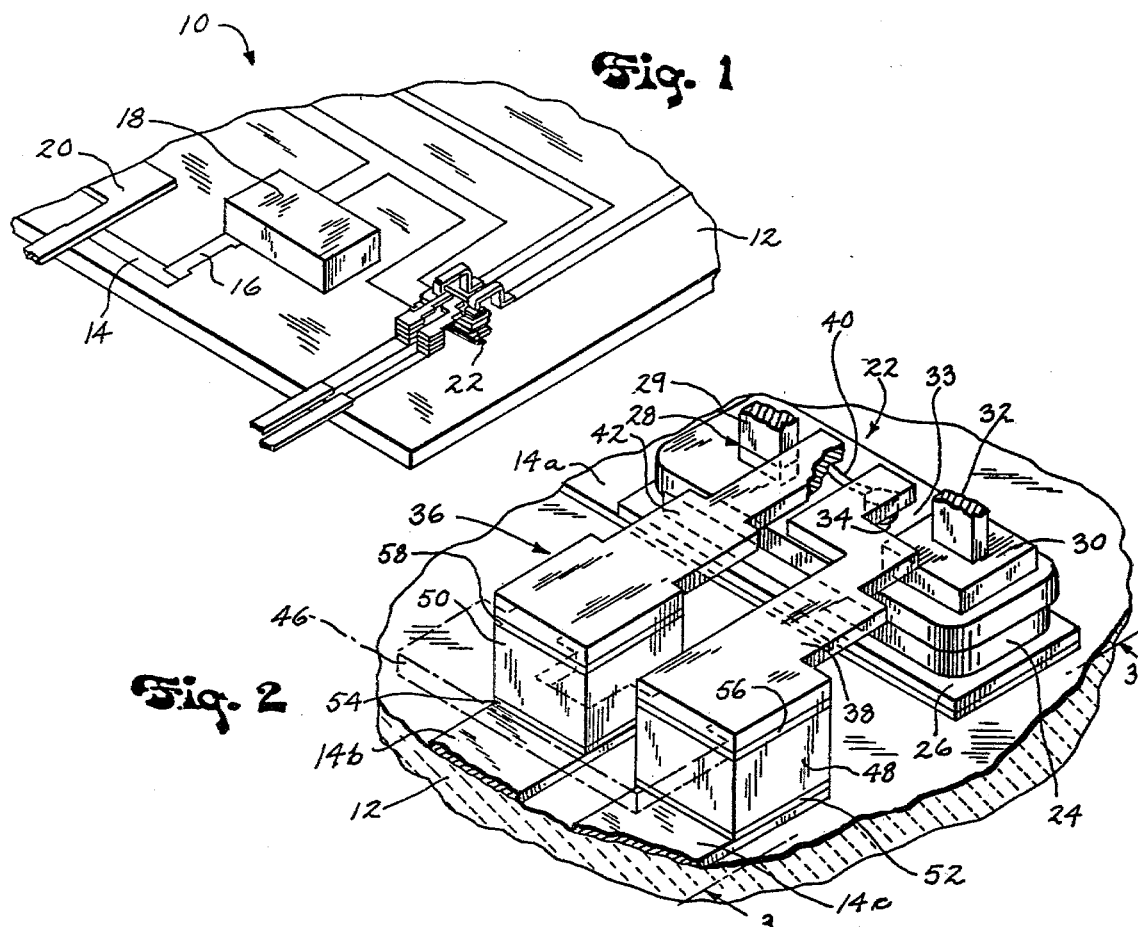
Fig. 1
Fig. 2
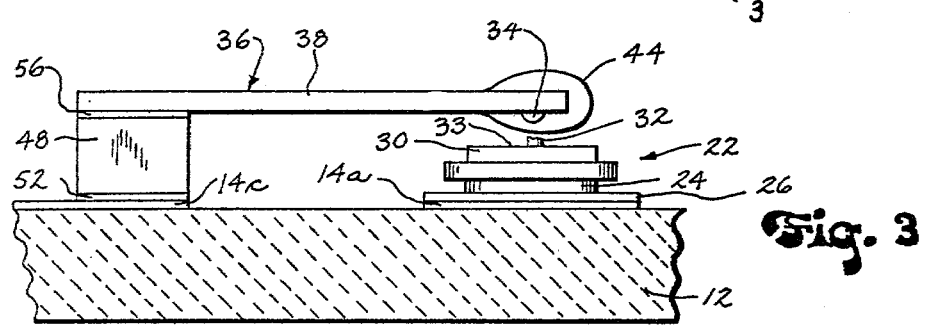
Fig. 3
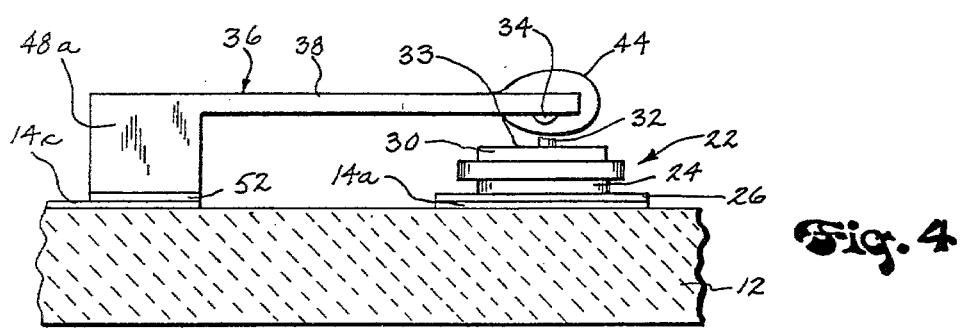
Fig. 4

POSITIONING MEANS FOR OPTICALLY COUPLABLE CIRCUIT ELEMENTS

BACKGROUND AND SUMMARY OF THE PRESENT INVENTION

Opto-electronic elements alter their electrical condition responsive to the application of light and vice-versa. Such elements include light emitting diodes which emit light when electrically energized. A light emitting diode may be used to actuate a phototransistor or light actuated controlled rectifier which alters their current conducting properties upon the application or removal of light. Because of the optical coupling between such opto-electronic components, good isolation between input and output circuitry or power and control circuitry may be obtained, as well as other advantages such as enhancement of the miniaturization obtainable with thick film conductor circuitry mounted on a ceramic substrate.

The required optical coupling depends on juxtapositioning the opto-electronic elements so that the light emitted from one falls on the photo sensitive portion of the other. In the past, one technique for obtaining the necessary alignment has been to bend a lead frame element to provide proper positioning for the transmission of light between light emitting and light responding elements mounted on the substrate. Reference is made to Kaufman's copending application, Ser. No. 825,619, filed Aug. 18, 1977, now U.S. Pat. No. 4,156,148. In some constructions, one element is placed in a cavity bridged by the other element, as in U.S. Pat. No. 4,011,859.

However, it is now apparent that such techniques, while quite satisfactory, can be improved upon. The prior art did have some inflexibilities in design. For example, those applications using bent lead frame elements were limited to those locations where such lead frame elements were located. This was typically along the edge of the circuit substrate. Use in the interior of the substrate required special routing and design of the conductors to maintain circuit isolation between the uninsulated components. Further, the components were often hard to adjust to obtain the accurate alignment necessary for optimum optical coupling.

It is, therefore, the object of the present invention to provide an improved mounting arrangement for light responsive and light emitting elements to obtain their optical coupling. The arrangement of the present invention is highly flexible in location and use and permits accurage alignment of the elements.

In the present invention, a light responsive device, such as a light actuated controlled rectifier, is connected in one thick film conductor circuit and a light emitting element, such as a light emitting diode, is connected in a second separate thick film circuit. In one construction, the controlled rectifier is mounted on a non-conductive substrate while the light emitting diode is mounted above the substrate and optically coupled to a photo sensitive area of the controlled rectifier by a pair of arms which cantilever from spacers connected to the thick film conductors of the second circuit. The arms may be formed from lead frame elements and the spacers may be separately or integrally formed with the arms.

BRIEF DESCRIPTION OF THE DRAWING

FIG. 1 is a general perspective view of electrical circuitry incorporating the present invention.

FIG. 2 is a detailed perspective view of the improvement of the present invention.

FIG. 3 is a side view taken along the line 3—3 of FIG. 2.

FIG. 4 is a side view of another embodiment of the present invention.

DETAILED DESCRIPTION OF THE PREFERRED EMBODIMENT

As shown in FIG. 1, the circuit 10 in which the improvement of the present invention is incorporated includes a substrate 12, typically formed of a non-conductive material such as ceramic. A thick film circuit is applied to the surface of plate 12. The circuitry may include elements such as conductors 14 or resistors 16 formed in the thick film itself, or other discrete elements, such as capacitor 18 or the like. Other portions of the circuit may be formed of lead frame elements such as the lead frame element 20. The circuitry includes a power circuit containing a silicon controlled rectifier 22 and an optically coupled control circuit which controls the operation of the power circuit.

The controlled rectifier is used to establish power levels in the power circuitry by the conduction intervals of the rectifier. The present circuit employs a light actuated silicon controlled rectifier (LASCR) 22 in the power circuit. Such a rectifier is rendered conductive by applying light to a photon sensitive area of the silicon controlled rectifier when the anode and cathode voltages are appropriate for conduction. It will be appreciated that other light responsive elements such as a triac or transistor may be utilized as a power controlling element. It will further be understood that the term "light" is not limited to visible light but encompasses infrared, ultraviolet, or other appropriate portions of the electromagnetic spectrum.

The light source used to trigger controlled rectifier 22 may comprise a light emitting diode.

As shown more clearly in FIGS. 2 and 3, controlled rectifier 22 has an anode 24, mechanically fastened and electrically coupled to thick-film conductor 14a by a conductive bonding agent or solder 26. Controlled rectifier 22 also includes a conventional gate 28 having a connecting lead 29, and a cathode 30 connected to lead 32.

The light emitting diode must be positioned so that the light emitted by the diode when the diode is energized will fall on a photo-sensitive area as at 33 of the silicon controlled rectifier to permit the controlled rectifier 22 to become conductive. The light emitting diode is spaced from the sensitive area 33 and is accurately aligned and focussed for reliable operation.

For this purpose, and as shown in FIGS. 2 and 3, the light emitting diode 34 is mounted on arms means 36. Arm means 36 includes one arm 38 to which light emitting diode 34 is mechanically fastened and to which one terminal of the light emitting diode is electrically connected. The other terminal, for example, wire 40 of light emitting diode 34 is connected to a second arm 42. The light emitting diode 34 is thus connected in series with arms 38 and 42. Light emitting diode 34 and the ends of the arms are covered with a bonding material 44, such as an epoxy resin, which is transparent to the light emitted by diode 34 to form the elements into an integral structure. The epoxy 44 also operates to focus the light from diode 34 to the sensitive area 33. Arms 38 and 42 may be formed in the manner of a lead frame having a bridging member 46, shown in dotted lines in FIG. 2 which is removed in the concluding stages of fabrication after bonding material 44 has been applied. The lead frame of arms 38 and 42 is typically many times thicker than thick-film conductor 14.

Light emitting diode 34 is positioned in proximity to the sensitive area 33 by electrically conductive spacers 48 and 50 which are inserted between arms 38 and 42 and thick film conductors 14b and 14c at the ends of the arms opposite those containing light emitting diode 34. Spacers 48 and 50 are fixed to the arms and thick film conductors by solder layers 52 and 54 and 56 and 58. Arms 38 and 42 are thus cantilevered beyond spacers 48 and 50. Light emitting diode 34 is series connected between conductors 14b and 14c so that a current in the circuit energizes the diode to emit light and actuate controlled rectifier 22. Spacers 48 and 50 may be formed from metal sheets similar to the lead frames of arms 38 and 42. Bonding material 44 insures the necessary spacing and isolation between the two elements and facilitates photo coupling by focusing the light upon the light sensitive area 33.

After light emitting diode 34 and controlled rectifier 22 have been properly aligned, as by melting the solder layers and moving light emitting diode 34 into the desired position, the entire structure may be coated with a clear epoxy resin, not shown, for protective purposes and to maintain the alignment of light emitting diode 34 and the light sensitive area 33, after which the entire substrate 12 may be encapsulated in an appropriate opaque potting compound to shield the elements from ambient light and physical damage.

While spacers 48 and 50 have been shown as a separate element in FIGS. 2 and 3, it will be appreciated that it may be integrally formed with either or both of arms 38 and 42 or conductors 14b and 14c. For example, and as shown in FIG. 4, arms 38 and 42 may be formed thicker than required and the portions adjacent light emitting diode 34 and the connection of terminal 40 etched away to leave a spacer portion 48a. Or, the thickness of conductor 14c may be increased to provide the spacer.

Various modes of carrying out the invention are contemplated as being within the scope of the following claims particularly pointing out and distinctly claiming the subject matter which is regarded as the invention.

I claim:

1. An optically coupled solid state power device, comprising:
   an electrically non-conductive substrate providing a substantially planar surface having at least first and second circuits of thick-film conductors applied thereto,
   an optically couplable light responsive controllable current conduction circuit including a light responsive device and a light emitting element, said light responsive device being mounted on said substrate and connected to the thick-film conductors of the first circuit; and
   arm means having a first portion mounting said light emitting element adjacent one end thereof for rendering the device and element optically couplable and a second portion connected to said thick-film conductors of said second circuit and cantilevering said element into proximity with said device mounted on said substrate to optically couple said element and device.

2. The power device of claim 1 wherein said first arm portion comprises a separate spacer element interposed intermediate said thick-film conductors of said second circuit and said second arm portion.

3. The power device of claim 1 wherein said arm means includes a pair of arm elements connected in series with said conductors of said second circuit, said element having a pair of terminals each connected to one of said arm elements.

4. The power device of claim 1 wherein said arm means comprises a portion of a lead frame element.

5. The power device of claim 1, wherein said arm means includes a pair of arm elements operatively connected to provide an energizing circuit for said light emitting element with one arm supporting said light emitting element and the other arm connected to said light emitting element through an electrical lead, and an epoxy resin engaging said pair of arm elements for maintaining spacing therebetween and surrounding said light emitting element for focusing light to said light responsive device.

6. The power device of claim 1, wherein said light responsive device includes an anode, a cathode, a gate and a photon sensitive area, and said light emitting element is located immediately adjacent to said photon sensitive area for providing said controllable current conduction circuit.

7. An optically coupled solid state power device, comprising
   a non-conductive substrate having a substantially planar surface containing first, second and third thick-film conductors,
   a light responsive current conduction device operatively connected to said substrate to be electrically connected to said first thick-film conductor and having first and second current conducting terminals and a light sensitive area selectively responsive to light to control the conduction of current between said first and second terminals and said first thick-film conductor,
   a first circuit arm having a first portion operatively connected to said substrate to be electrically connected to said second thick-film conductor and a second portion cantilevered to be spaced in overlapping relationship with respect to said current conduction device,
   a second circuit arm having a first portion operatively connected to said substrate to be electrically connected to said third thick-film conductor and a second portion cantilevered to be spaced adjacent to said first arm,
   a light emitting element electrically connected to said second cantilevered portion of said first arm and aligned to selectively provide light to said light sensitive area of said current conduction device,
   a circuit lead electrically connecting said second cantilevered portion of said second arm to said light emitting element to form an energizing circuit between said second and third thick-film conductors through said light emitting element, and
   an epoxy resin engaging said first and second arms to secure said arms together and to maintain spacing therebetween and surrounding said light emitting element to focus light to said light sensitive area to selectively energize said current conduction device.

* * * * *